United States Patent [19]

Roehrs et al.

[11] Patent Number: 4,733,194

[45] Date of Patent: Mar. 22, 1988

[54] APPARATUS AND METHOD FOR PARALLELING POWER FIELD EFFECT TRANSISTORS IN HIGH FREQUENCY AMPLIFIERS

[75] Inventors: Don P. Roehrs, New River; Helge O. Granberg, Phoenix, both of Ariz.

[73] Assignee: Signal One Corporation, Phoenix, Ariz.

[21] Appl. No.: 58,592

[22] Filed: May 26, 1987

Related U.S. Application Data

[63] Continuation of Ser. No. 701,492, Feb. 14, 1985, abandoned.

[51] Int. Cl.$^4$ ............................ H03F 3/26; H03F 3/68
[52] U.S. Cl. ................................. 330/251; 330/276; 330/277; 330/285; 330/295; 330/300
[58] Field of Search ............... 330/10, 55, 136, 207 A, 330/251, 264, 269, 276, 277, 285, 295, 297, 300

[56] References Cited

U.S. PATENT DOCUMENTS 3,443,241  5/1969  Pitzalis, Jr. ........................... 330/285
4,275,359  6/1981  Yoshida et al. ................... 330/300 X
4,535,298  8/1985  Covill .............................. 330/295 X

OTHER PUBLICATIONS

Ikeda, "Development of a Solid State Radio Transmitter with MOS/FET", *IEEE Transactions on Broadcasting,* vol. BC-26, No. 4, Dec. 1980, pp. 99–112.
Raab, "Radio Frequency Pulsewidth Modulation", *IEEE Transactions on Communications,* Aug. 1973, pp. 958–966.

*Primary Examiner*—James B. Mullins
*Attorney, Agent, or Firm*—William W. Holloway

[57] ABSTRACT

Switching power amplifier circuits for use in a frequency range from 0.5 MHz to 100 MHz are described. The power amplifier circuits have power field effect transistor (FET) devices as output components and the FET devices are driven by bipolar transistor devices without frequency limiting components. The power amplifier circuits can be coupled in parallel and the coupled amplifier circuits can be operated in a push-pull mode of operation for increased power. The systems using these amplifier devices can operate in a Class A, B, C, D, E, F and S modes. In particular, a Class D amplifier system is described that uses the switching power amplifier circuits in the extended frequency range.

9 Claims, 7 Drawing Figures fig.1 fig.2 fig. 5 fig.6a fig.6b

APPARATUS AND METHOD FOR PARALLELING POWER FIELD EFFECT TRANSISTORS IN HIGH FREQUENCY AMPLIFIERS

This is a continuation of co-pending application Ser. No. 06/701,492 filed on Feb. 14, 1985, and now abandoned.

BACKGROUND OF THE INVENTION

1. Field of the Invention

This invention relates generally to radio frequency amplifiers operating in the 0.5 MHz to 100 MHz frequency range and used in Classes A, B, and C modes of operation and more particularly to RF power switching amplifiers used in Classes D, E, F and S modes of operation in the same range of operation.

2. Description of the Related Art

In the frequency range from approximately 0.5 MHz to 100 MHz, vacuum tubes in various configurations have been used to achieve significant power. For example, power grid electron tube devices are currently employed in applications at these frequencies such as used in Class A, B, C, D, E, F and S modes of operation. (A general description of these modes of operation is included in "Solid State Radio Engineering," H. L. Krauss, C. W. Bostian and F. H. Raab; John Wiley and Sons, 1980, Section 14-1 through 14-6 and 16-7). The vacuum tube devices have performed in satisfactory manner but are relatively expensive, exhibit a maximum efficiency of approximately 50%-60% and have limited lifetime. These devices also have narrow band characteristics when compared to semiconductors. More recently, solid state broad band devices have been fabricated that can achieve significant power at levels previously reserved for vacuum tube technology, (e.g., "Power MOSFETS versus Bipolar Transistors"; r.f. design, November/December 1981 pages 11-15 by H. O. Granberg). A variety of problems have prevented the solid state technology from achieving the full potential in this frequency range which the operating characteristics suggest is possible. To achieve useful power levels, the semiconductor devices must typically be operated in parallel. With respect to bipolar transistors, the low input impedances have made the use of these devices, operating in parallel, impractical. Any difference in the input capacitance in the the base-emitter junction forward characteristics would result in uneven sharing of input power and unequal power output levels. The power field effect transistor (FET) devices are more tolerant in this respect because of higher input impedances. However, at higher frequencies, the same result can exist. When two power field effect transistor devices are operated in parallel, there is a tendency for the two FET devices to break into a spontaneous, relaxation type oscillation when the parasitic capacitances and stray inductances have appropriate values.

To obtain the higher power levels achievable by parallel operation of transistor devices, the implementation of the paralleling technique is provided by isolation between transistor input terminals by means of hybrid couplers, transmission lines etc. For the low impedances associated with the semiconductor devices, these implementations of isolating apparatus between semiconductor devices necessitates impedance transformation to a higher level, typically 50 ohms. The impedance transformation can be accomplished with LC matching networks or wideband radio-frequency transformers. These implementations have limited bandwidth resulting in degradation at both high and low frequencies. Typically this type of isolation between semiconductor devices is essential only on the input side of the power amplifiers, but can also be implemented on the output side of the amplifiers.

In the case of power field effect transistor devices, the drain terminals of these devices can be coupled in parallel more easily than the collector terminals of bipolar transistor devices because the field effect transistor devices are not subject to certain failures, such as thermal runaway. The FET devices have a higher input impedance than the bipolar devices and lack the forward biased base-emitter junction. The FET gate input terminal can be directly coupled in parallel, providing the resonance of the stray capacitances and the stray inductances of the devices are within certain values. However, with large devices, these conditions are seldom achieved and the gate terminals must be isolated, typically by apparatus similar to that of the bipolar devices. LC input and output matching networks can be used to transform the low impedance of the input and output terminals to 50 ohms, the common impedance for industrial and communications applications. It is also known to isolate power FET devices by placing resistors in series with the gate terminals. This technique seriously degrades the frequency response and system performance. Only recently have the solid state devices become available that function usefully at these frequencies.

A need has therefore been felt for a power amplifier unit in which a plurality of amplifying units can be coupled in parallel and can be operated between 0.5 MHz while 100 MHz and utilizing all solid state devices. A need has also been felt for a Class D amplifier device exhibiting 80%-90% efficiency that can utilize these power amplifier units. These power amplifier units can employ FET devices coupled in parallel to achieve output power in the multi-kilowatt range.

SUMMARY OF THE INVENTION

It is therefore an object of the present invention to provide an improved radio frequency power amplifier.

It is a further object of the present invention to provide an improved switching amplifier suitable for Class D mode of operation.

It is a still further object of the present invention to provide method and apparatus for a power amplifier circuit employing power field effect transistor devices that can be operated in parallel with other similar amplifier devices.

It is a further object of the present invention to provide a signal processing unit suitable for use in a Class D amplifier that can operate in the frequency range above 1.6 MHz, the current operating frequency limit for solid state devices.

It is a further object of the present invention to provide a first set of power amplifiers coupled in parallel and a second set of amplifiers coupled in parallel, the two sets of amplifier coupled in a push-pull mode of operation.

The aforementioned and other objects are accomplished, according to the present invention, by providing a power amplifier circuit that can be coupled in parallel with other power amplifier circuits. The parallel amplifier circuits can be further coupled to another group of amplifier circuits, coupled in parallel, and the two groups of amplifier circuits can be operated in a push-pull mode of operation to drive an output load impedance. The amplifier circuit is comprised of a power field effect transistor device driven by a PNP and NPN emitter-follower circuit. The emitter-follower circuits, in addition, provide an isolation mechanism for preventing spontaneous oscillation between the FET devices, coupled in parallel, of the power amplifier stage. The signal processing circuit is implemented with solid state devices that have the required frequency characteristics and provide a signal with appropriate characteristics for driving the power amplifier circuits.

These and other features of the present invention will be understood upon reading of the following description along with the figures.

DESCRIPTION OF THE PREFERRED EMBODIMENT

Detailed Description of the Figures

Figure 1:
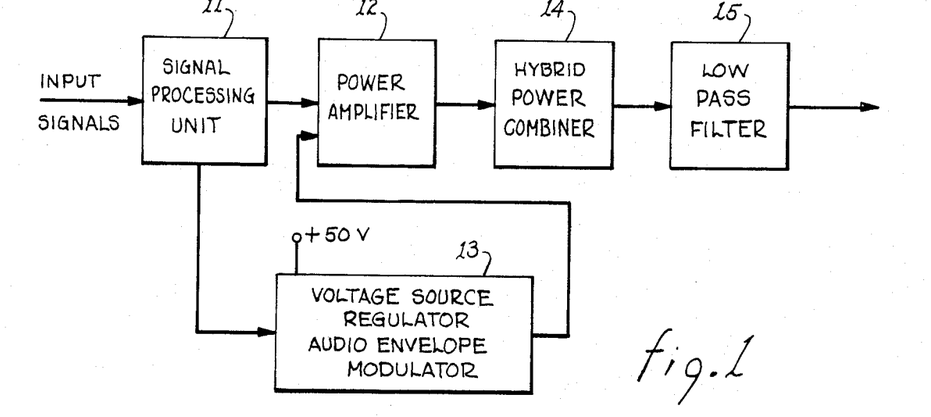
FIG. 1 is a block diagram of the components of a switching amplifier circuit acting in a Class D mode of operation.

Referring to FIG. 1, the block diagram of a high frequency switching amplifier acting in a Class D mode of operation is shown. Radio frequency input signals are applied to the signal processing unit 11. The output signal from the signal processing unit 11 is applied to power amplifier 12. A peak detector output signal from the signal processing unit 11 is applied to the voltage source regulator, audio envelope modulator 13 and can be used to control the +50 volt supply voltage for modulation of the power amplifier 12. By controlling the voltage applied to power amplifier 12 as a function of the modulation of the input RF signal, this modulation is now superimposed on the output signal. The RF output signal from the power amplifier 12 is applied to a hybrid power combiner 14, while the output signal from the hybrid power combiner 14 is applied to low pass filter 15. The RF output signal of the low pass filter 15 is the resultant output signal of the amplifier system.

Figure 2:
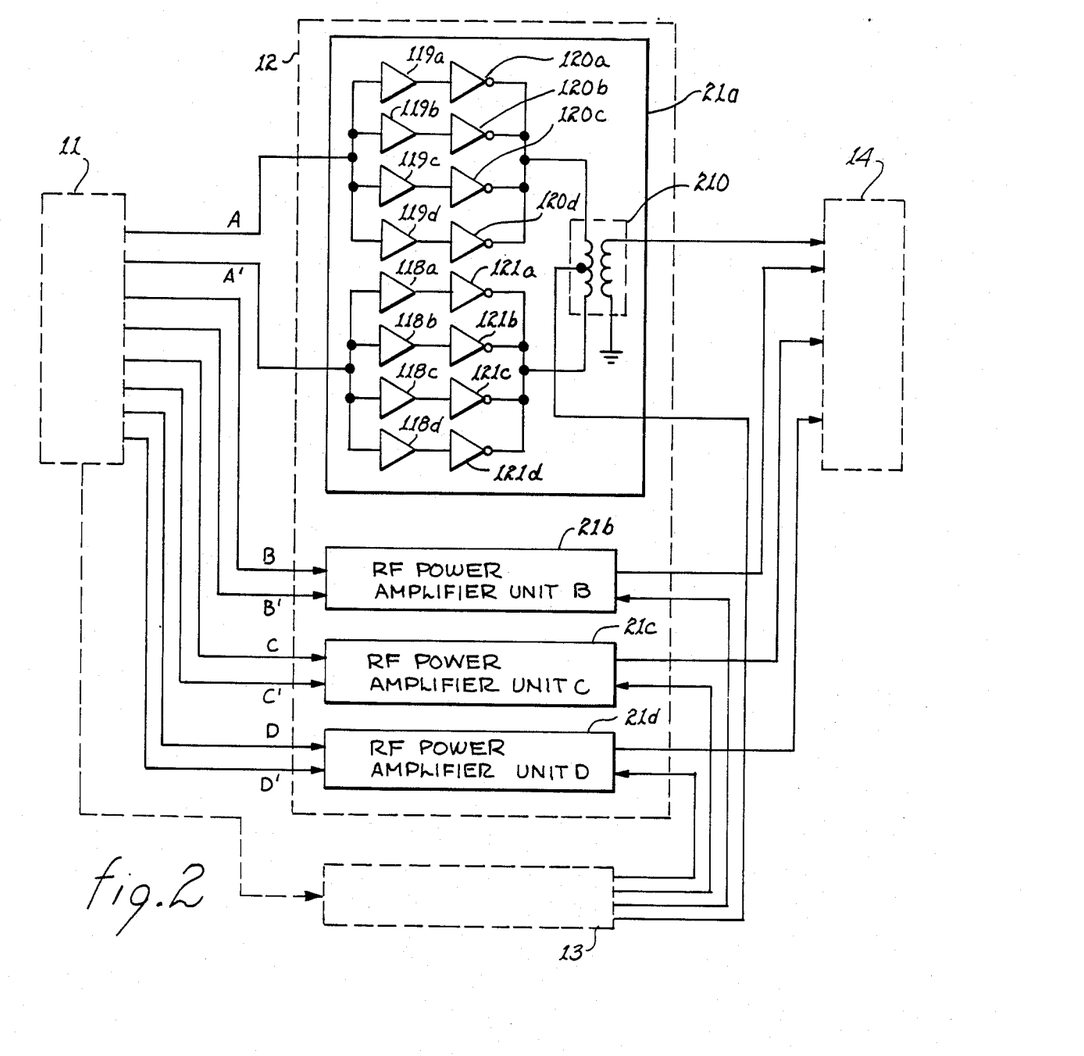
FIG. 2 is a more detailed block diagram of the power amplifier used in the switching amplifier of FIG. 1.

Referring next to FIG. 2, a more detailed block diagram of the power amplifier 12 of FIG. 1 is shown. Power amplifier 12 is shown as including four component RF power amplifier units, 21a, 21b, 21c and 21d. The RF power amplifier unit A of 21a is shown in more detail. A first group of final power amplifiers 120a, 120b, 120c and 120d are coupled in parallel and receive signals from driver amplifiers 119a, 119b, 119c and 119d respectively. The driver amplifiers receive RF carrier signals having a first phase (A) from signal processing unit 11. A second group of final power amplifiers 121a, 121b, 121c and 121d, receiving signals from driver amplifiers 118a, 118b, 118c and 118d respectively are operated in push-pull with the first group amplifiers and are driven by signals from signal processing unit 11 with a second phase (A'). The two sets of parallelly coupled amplifier circuits are operated in a push-pull mode; i.e., phase A and phase A' are 180° out of phase and are coupled to a load impedance through the output transformer 210 that, in turn, supplies the output signal to hybrid power combiner 14. The voltage source regulator, audio envelope modulator circuit 13 applies signals to the power amplifier unit 21a. In the preferred embodiment, a plurality of RF power amplifier units 21b, 21c and 21d can be coupled in parallel when additional power is required.

Figure 3:
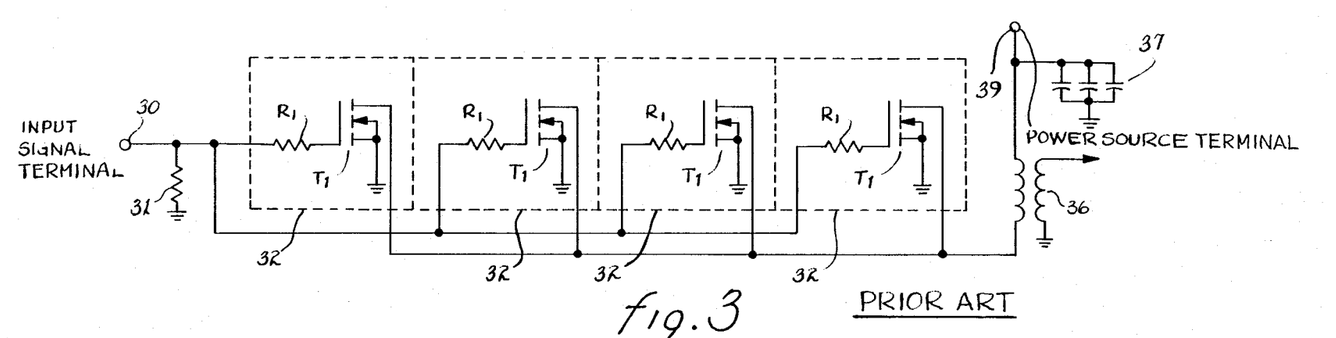
FIG. 3 is a circuit diagram of a multiplicity of power FET devices coupled in parallel according to the prior art.

Referring to FIG. 3, an example of the prior art, in which a circuit with field effect transistor devices coupled in a parallel configuration, is shown. In each amplifier circuit 32, a power supply voltage terminal 39 is coupled through a plurality of capacitors 37 to the ground potential and to one terminal of a load impedance (transformer) 36. A second terminal of the load impedance 36 is coupled to the drain terminal of the power FET device $T_1$ in each amplifier circuit 32. The source of each power FET device $T_1$ is coupled to ground, while the gate of each power FET device $T_1$ is coupled through a resistance $R_1$ to signal input terminal 30. The signal input terminal is also coupled through resistor 31 to a common potential.

Figure 4:
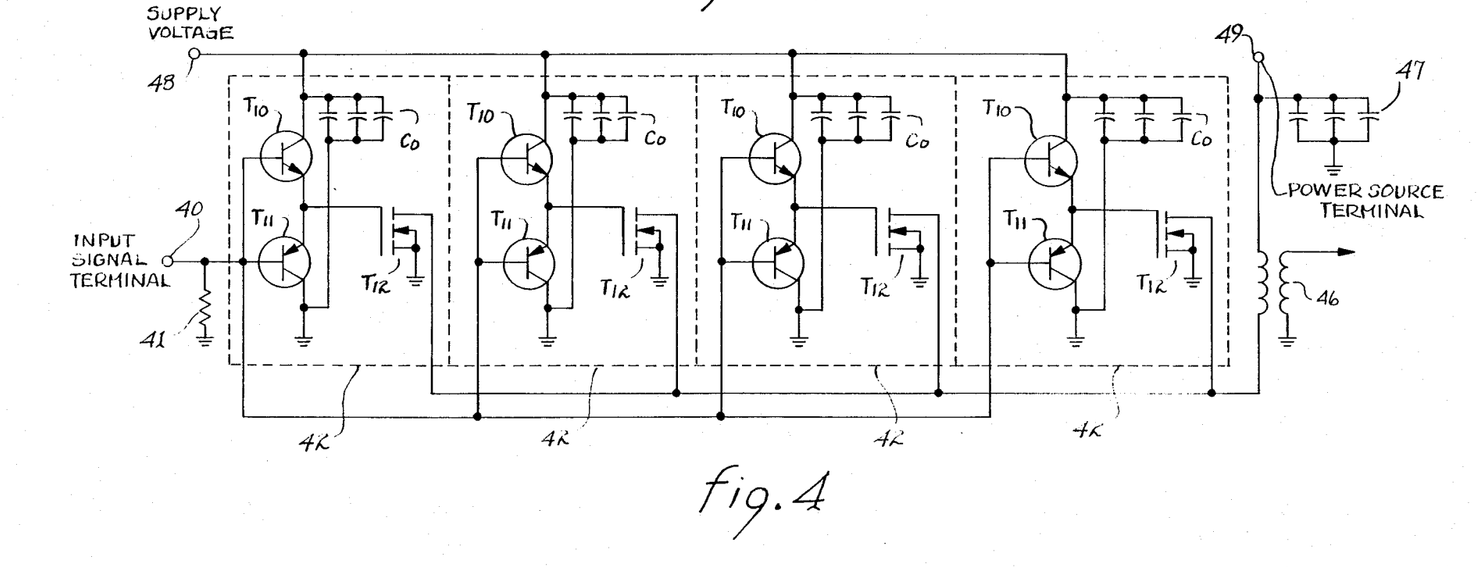
FIG. 4 is a circuit diagram of multiplicity of power FET devices coupled in parallel according to the present invention.

Referring now to FIG. 4, the RF power amplifier unit in which a plurality of power FET devices are operated in parallel is shown. In each amplifier circuit 42, a signal input terminal 40 is coupled through resistor 41 to ground and is coupled to the base terminal of bipolar transistors $T_{10}$ and $T_{11}$ in each of the identical power amplifier circuits 42 of the unit. The power supply voltage terminal 48 is coupled to the collector terminal of NPN transistor $T_{10}$, while the collector terminal of PNP transistor $T_{11}$ is coupled to ground potential. The emitter of transistor $T_{10}$ is coupled to the emitter of transistor $T_{11}$, the two emitter terminals being coupled to the gate terminal of FET device $T_{12}$. The source terminal of FET device $T_{12}$ is coupled to the common potential, while the drain terminal of FET device $T_{12}$ is coupled to one terminal of the load impedance 46. A second terminal of load impedance is coupled to the power source 49 and through capacitors 37 to the common potential. Also coupled between the power supply voltage 48 and the common potential are a plurality of capacitors $C_0$ which decouples the power supply voltage 48 from the amplifier circuit.

Figure 5:
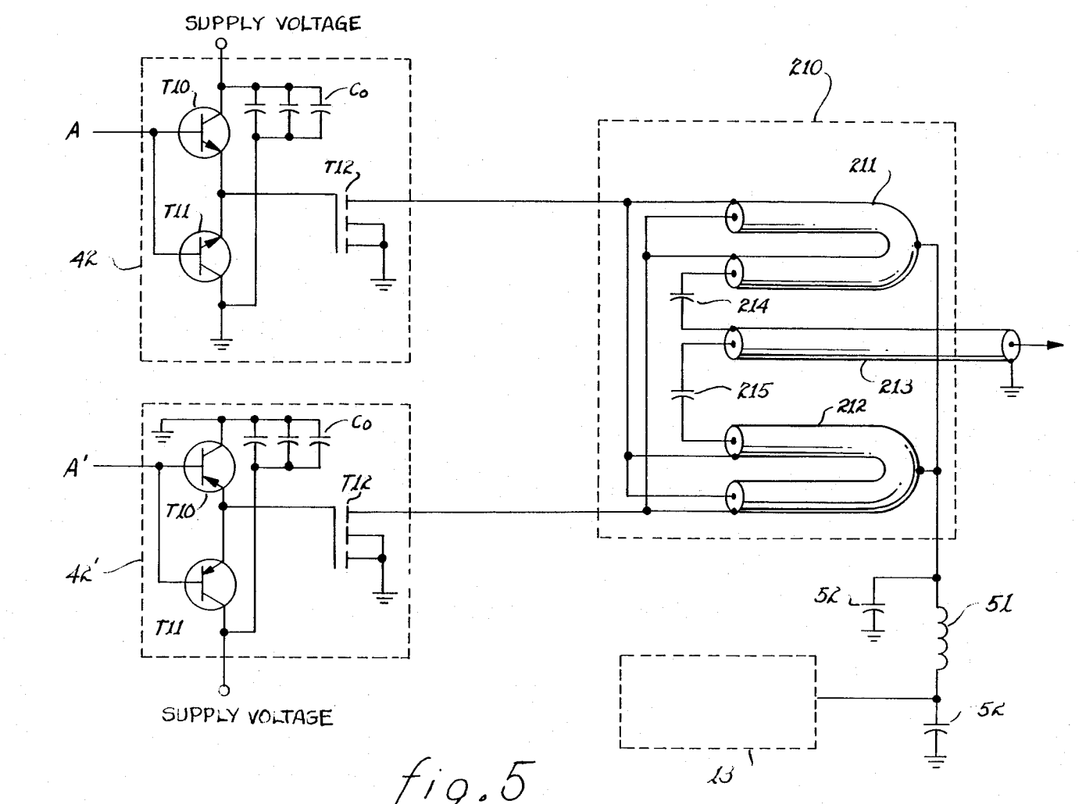
FIG. 5 is a circuit diagram of the final stages of two of the amplifier units of FIG. 4 driving a load impedance in a push-pull mode of operation.

Referring next to FIG. 5, the final output power amplifier circuits of the power amplifier units of FIG. 4 are shown coupled to a transmission line transformer 210 in a push-pull operational configuration. The drain output terminals of FET devices $T_{12}$ of unit 42' are coupled to a shield input terminal of transmission line 211 and to a shield output terminal and a center conductor input terminal of transmission line 212. The drain terminals of FET device $T_{12}$ in the opposite phase power amplifier unit 42' are coupled to a center conductor input terminal and to shield output terminal of transmission line 211 and to a shield input terminal of transmission line 212. The center conductor output terminal of the transmission line 212 is coupled through capacitor 215 to a center conductor input terminal of transmission line 213, while a center conductor output terminal of transmission line 211 is coupled through capacitor 214 to a shield input terminal of transmission line 213. An output signal from voltage source, regulator audio envelope modulator 13 is coupled through a filter, comprised of inductance 51 in capacitors 52, to intermediate terminals of transmission lines 211 and 212. The center conductor output terminal of transmission line 213 provides the output signal for power amplification unit 21a.

Figure 6A:
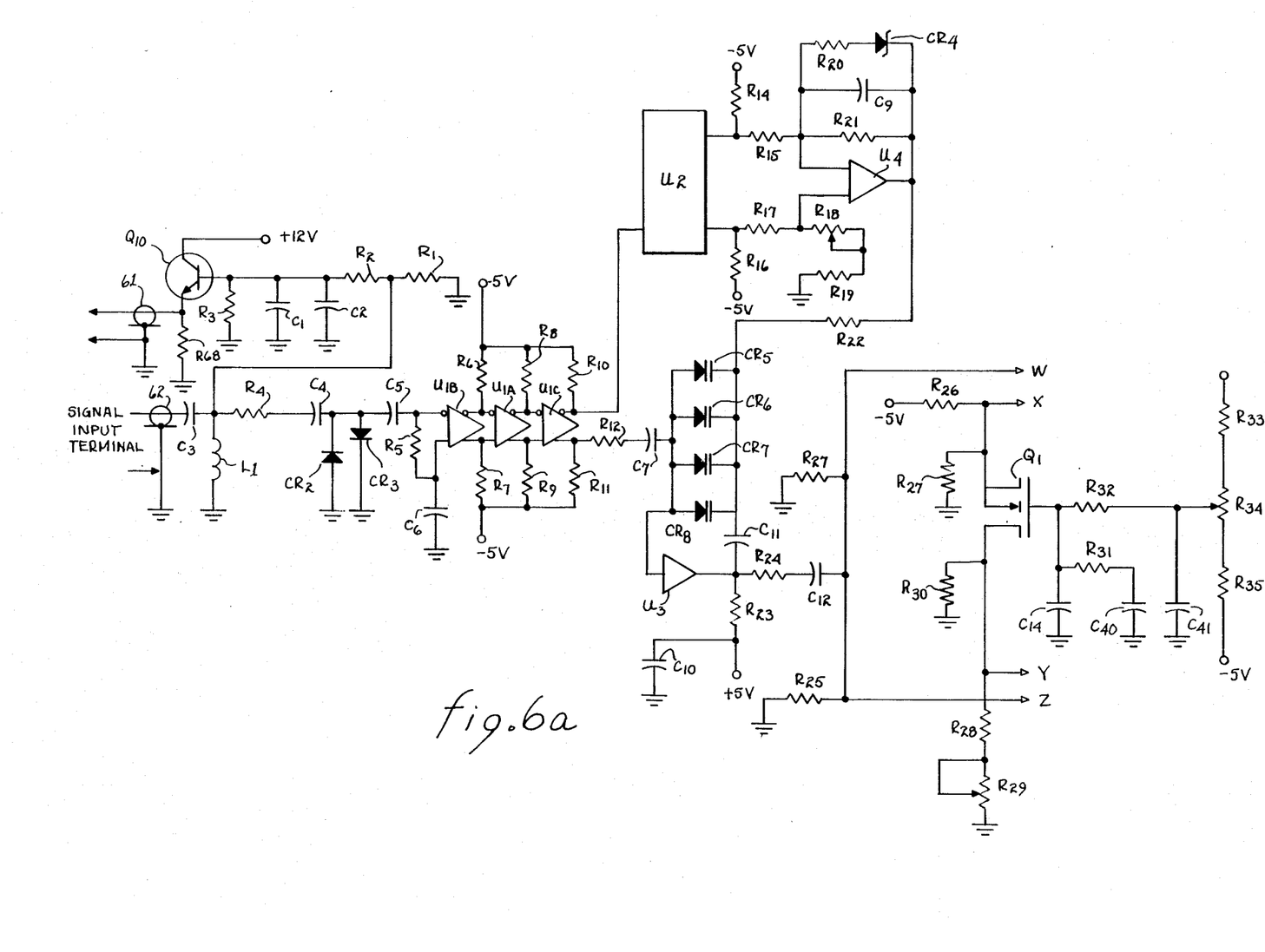
FIGS. 6a and 6b are a circuit diagram of the signal processing circuit for supplying an output signal to a high frequency power amplifier according to the present invention.
Figure 6B:
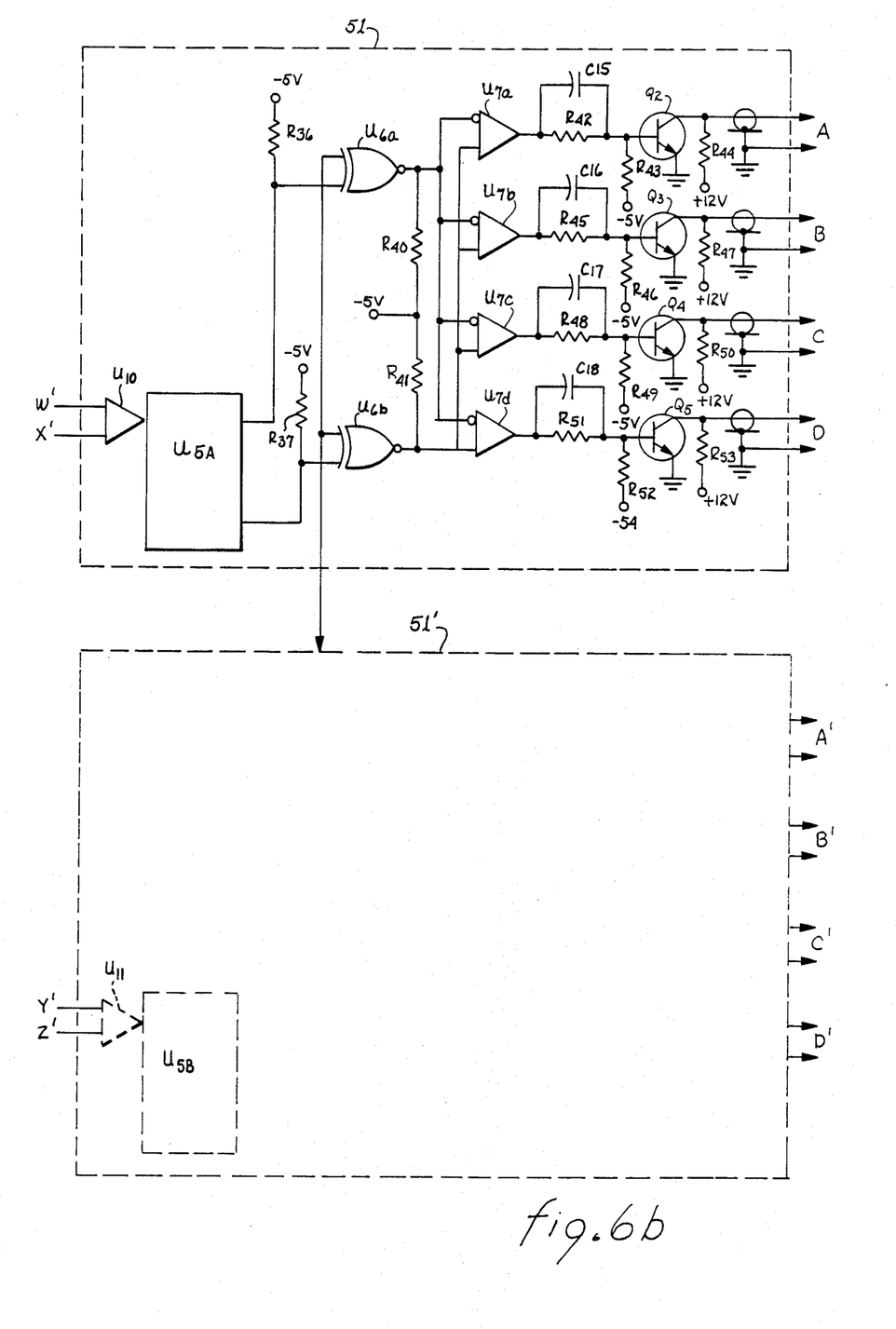

Referring now to FIG. 6a, an input terminal 62 receives the RF input signal. Input terminal 62 is coupled through capacitor $C_3$ to a first terminal of inductance $L_1$, to a first terminal of resistor $R_4$, to a first terminal of resistor $R_1$, and to a first terminal of resistor $R_2$. A second terminal of resistor $R_1$ and a second terminal of inductor $L_1$ are coupled to the ground potential. A second terminal of resistor $R_2$ is coupled through capacitor $C_2$ to the ground potential, through capacitor $C_1$ to the ground potential, through resistor $R_3$ to the ground potential and to the base of transistor $Q_{10}$. The emitter of transistor $Q_{10}$ is coupled through resistor $R_{68}$ to the ground potential and also is the output terminal for application of a signal to the voltage source regulator, audio envelope modulator unit 13. The collector of transistor $Q_{10}$ is coupled to the 12 volt power supply. A second terminal of resistor $R_4$ is coupled to capacitor $C_4$. A second terminal of capacitor $C_4$ is coupled through diode CR2 to the ground potential, through diode CR3 to the ground potential and through capacitor $C_5$ to an inverted input terminal of amplifier $U_{1B}$. This terminal of amplifier $U_{1B}$ is also coupled through resistor $R_5$ to a second input terminal of amplifier $U_{1B}$ and the second input terminal of amplifier $U_{1B}$ is coupled through capacitor $C_6$ to the ground potential. The inverted output terminal of $U_{1B}$ is coupled to an inverted input terminal of $U_{1A}$, while a second output terminal of $U_{1B}$ is coupled to a second intput terminal of $U_{1A}$. A first inverted output terminal of $U_{1A}$ is coupled to a first inverted input terminal of $U_{1C}$ while a second output terminal of $U_{1A}$ is coupled to a second input terminal of amplifier $U_{1C}$. The second output terminal of $U_{1C}$ is coupled through resistor $R_{12}$ and capacitor $C_7$ to a group of parallelly connected voltage controlled capacitor diode CR5, CR6, CR7, CR8 and an intput terminal of amplifier $U_3$. A second inverted input terminal of amplifier $U_{1C}$ is coupled to an input terminal of monostable multivibrater $U_2$. The inverted output terminals of amplifiers $U_{1B}$, $U_{1A}$ and $U_{1C}$ are coupled through resistors $R_6$, $R_8$ and $R_{10}$, respectively, to a $-5$ volt power supply whle the second output terminal of amplifiers $U_{1B}$, $U_{1A}$ and $U_{1C}$ are coupled respectfully through resistors $R_7$, $R_9$ and $R_{11}$ to a $-5$ volt power supply. The output terminal of amplifier $U_3$ is coupled through resistance $R_{23}$, to a $+5$ volt terminal and through capacitor $C_{11}$ to the cathodes of voltage controlled capacitor/diodes CR8, CR7, CR6 and CR5 and to a first terminal of resistor $R_{22}$. A second terminal of resistor $R_{22}$ is coupled to the output terminal of amplifier $U_4$ and to a first terminal of resistor $R_{21}$, a first terminal of capacitor $C_9$, and to the cathode terminal of diode CR4. The anode of diode CR4 is coupled through resistor $R_{20}$ to a second terminal of capacitor $C_9$, a second terminal of resistor $R_{21}$, to a first input terminal of amplifier $U_4$ and through resistor $R_{15}$ to an output terminal of monostable multivibrater $U_2$. The output terminal of monostable multivibrater $U_2$ is also coupled through resistor $R_{14}$ to a $-5$ volt supply. The second positive input terminal of amplifier $U_4$ is coupled through resistor $R_{17}$ to a second output terminal of monostable multivibrator $U_2$ and through a variable resistor $R_{18}$ in series with a resistor $R_{19}$ to the ground potential. A second terminal of resistor $R_{24}$ is coupled through capacitor $C_{12}$ to a positive input terminal of amplifier $U_{10}$ and to a negative input terminal of amplifier $U_{11}$. The negative amplifier terminal of $U_{11}$ is also coupled through resistor $R_{25}$ to the ground potential. The positive input terminal of amplifier $U_{11}$ is coupled through resistor $R_{30}$ to ground and to a drain terminal of transistor $Q_1$. The source terminal of transistor $Q_1$ is coupled through resistor $R_{27}$ to ground potential, is coupled to an input terminal of amplifier $U_{10}$ and is coupled through resistor $R_{26}$ to the $-5$ volt power supply. The gate terminal of transistor $Q_1$ is coupled to a duty cycle control network $R_{31}$ through $R_{35}$ and $C_{14}$, $C_{40}$ and $C_{41}$ by adjusting the maximum voltage potential of the triangular wave signal from frequency integrator $U_3$. The amplifiers $U_{10}$ and and the input network 51 in FIG. 6b is the point at which the network for the control signal and inverted control signal are duplicated, network 51 being replicated in network 51'. The output terminal of amplifier $U_{10}$ is coupled to an input terminal of comparator $U_{5A}$. An output terminal of comparator $U_{5A}$ is coupled to an input terminal of exclusive NOR gate $U_{6A}$ and through resistor $R_{36}$ to the $-5$ volt power supply. A second output terminal of comparator $U_{5A}$ is coupled to a first input terminal of exclusive NOR gate $U_{6B}$ and through resistor $R_{37}$ to the $-5$ volt supply. The second input terminal of exclusive NOR gate $U_{6A}$ and the second terminal of $U_{6B}$ are coupled together and to similar elements in the inverted signal circuit 51'. An output terminal of exclusive NOR gate $U_{6A}$ is coupled through resistor $R_{40}$ to the $-5$ volt supply and to inverted input terminals of amplifiers $U_{7D}$, $U_{7C}$, $U_{7B}$ and $U_{7A}$. The output of exclusive NOR gate $U_{6B}$ is coupled to input terminals of amplifiers $U_{7A}$, $U_{7B}$, and $U_{7C}$ and $U_{7D}$ and through resistor $R_{41}$ to the $-5$ volt power supply. The output terminal of $U_{7A}$ is coupled through a parallelly coupled circuit of resistor $R_{42}$ and capacitor $C_{15}$ to a base terminal of transistor $Q_2$. The base terminal of transistor $Q_2$ is also coupled through resistor $R_{43}$ to the $-5$ volt power supply. The emitter of transistor $Q_2$ is coupled to the ground potential while the collector of transistor $Q_2$ is coupled through resistor $R_{44}$ to the $+12$ volt potential and provides the driving signal for the module A of the power amplifiers. Similar networks are shown for providing the output to power amplifier module B, power amplifier module C and power amplifier module D. The inverted signals for these power amplifiers are provided by identical circuits in network 51'.

Operation of the Preferred Embodiment

Referring once again to FIG. 4, the power amplifier for the switching circuit, four power amplifiers connected in parallel, are shown. The power FET device $T_{12}$, for example Motorola MRF 150, provides the output power to the load impedance, typically through a transformer or other impedance coupling element. The gate of power FET T12 is driven by emitter-coupled transistors $T_{10}$ and $T_{11}$. Because of the internal capacitance of the transistors $T_1$ of the circuit in FIG. 3, the presence of the resistor $R_1$ provides a severe limitation with respect to frequency for values of $R_1$ that effectively prevent oscillation among the field effect transistors. This problem is alleviated by the use of two bipolar transistor $T_{10}$ and $T_{11}$ driving the field effect transistor $T_{12}$. However, the frequency can be limited by the physical characteristics of the transistors. In particular, although satisfactory NPN transistors $T_{10}$ are commercially available, such as the Motorola MRF 630, a suitable PNP transistor $T_{11}$ was not commercially available and had to be specially manufactured. However, once the PNP transistor $T_{11}$ with suitable physical characteristics was implemented, then the output frequencies required for amplifier operation in the range above 10 MHz were available. As is standard procedure, a plurality of capacitors are coupled between the power supply and ground. It will be clear that the ability of transistors $T_{10}$ and transistors $T_{11}$ to discharge and charge current will provide the limitation on the frequency response of the field effect transistor $T_{12}$. It will also be clear to those skilled in the art that, at the frequencies for which the switching amplifier was intended, the final power amplifier device located the greatest distance from the load impedance will provide a diminished power to the load impedance. It was found that, with the physical layout utilized in the implementation, more than four parallel power FETs did not provide sufficient increase in output power to warrant the additional parallel amplifier circuits. The number of amplifier circuits is limited by the physical configuration of the system.

Referring next to FIG. 5, and to FIG. 2, it is seen that the two stages of multiply-coupled amplifiers, driven in a push-pull mode of operation, can be used to provide additional power. The two push-pull stages are coupled to a transmission line-type transformer. In the preferred embodiment, a number of push-pull power amplifier units can be coupled together to provide yet an increase in the output power.

Referring to FIG. 6a, the signal processor unit 11 used for providing the requisite output signals for the power amplifier from the RF input signal is shown. A peak detector circuit, including transistor $Q_{10}$ applies a signal in the 300 Hz to 3 KHz range to voltage source regulator, audio envelope modulator 13. The regulator/modulator 13 includes an audio amplifier that controls an emitter follower or voltage source regulator supplying the power source for the FET devices. The general technique is to apply amplitude information (i.e. the signal modulating the input RF signal) through the regulator/modulator 13 and phase information (i.e. the carrier signal of the RF input signal) through the signal processing unit 11, the two signals being combined in the output stage, i.e. load impedance 210. This technique is called envelope elimination and restoration. Diodes CR2 and CR3 provide an input diode clipping stage for the RF input signal, while amplifiers $U_{1A}$, $U_{1B}$, and $U_{1C}$ provide additional clipping. The voltage control capacitor/diodes $CR_5$, $CR_6$, $CR_7$, and $CR_8$ along with $U_3$ form a frequency integrator where the voltage controlled capacitor/diodes $CR_5$, $CR_6$, $CR_7$ and $CR_8$ help to keep the duty cycle constant by providing a constant amplitude triangular wave signal with the input signal carrier frequency signal at the output terminal of U3. The comparator $U_{5A}$ and its counterpart $U_{5B}$ are adopted to adjust the duty cycle of the wave and provide the ECL to TTL level conversion. Transistors $Q_2$ through $Q_5$ provide voltage amplification from the TTL level to the level required for the FET device, $T_{12}$ (typically 10 volts) to be fully turned on through the driver emitter follower $T_{10}$, $T_{11}$. Identical apparatus in network 51' provide the inverted phase signals. The signal processor unit output signals are applied to the emitter followers $T_{10}$, $T_{11}$, FIG. 4. The emitter follower circuits provide sufficient current amplification to charge and discharge the input capacitances of FETs $T_{12}$. In general, however, prior to the development of RF power MOSFET semiconductors such as the Motorola MRF 150 RF power MOSFET and the development of emitter-coupled-logic (ECL) components such as Motorola MC10198 for the monostable multivibrator $U_2$ and ECL components such as MC1650 for use as comparator $U_{5A}$ and $U_{5B}$, the development of signals in the range greater than 1.6 MHz range and Class D amplification would not be practical.

In addition, special high speed ECL Motorola versions of $U_1$ i.e. MC10H116, MC10H195, $U_6$, $U_7$ and $U_8$, MC10H125 have recently become available along with similar devices from other manufacturers.

The above description is included to illustrate the operation of the preferred embodiment and is not meant to limit the scope of the invention. The scope of the invention is to be limited only by the following claims. From the above description, many variations will be apparent that would yet be encompassed by the spirit and scope of the invention.

What is claimed is:

1. A power amplifier circuit capable of operating as a switching amplifier in the standard r(adio) f(requency) communications range of 1.6 MHz to 30 MHz and above, said power amplifier circuit using parallel power MOSFETs with active drivers without sacrificing frequency response and eliminating frequency limiting components such as resistors, low Q inductors, rf transformers, or any other passive elements increasing the series gate resistances of the power FETs thus limiting the band width, such elements or an active driver are required to prevent spontaneous oscillations in parallel power FETs, comprising:
   a plurality of N-channel power field effect transistors, each of said power field effect transistors having a source terminal coupled to a common potential and having a drain terminal coupled to a common load impedance; and
   a plurality of active driver circuits, each of said active driver circuits coupled to a common input terminal, each of said active driver circuits coupled to a gate of an associated power field effect transistor, each active driver circuit charging and discharging a gate terminal of said associated power field effect transistor thereby decoupling said associated gate terminal from gate terminals of other of said plurality of field effect transistors.

2. The power amplifier circuit of claim 1 wherein each of said active driver circuit is comprised of a pair of complimentary transistors.

3. A power amplifier circuit capable of operating as a switching amplifier in the standard r(adio) f(requency) communications range of 1.6 MHz to 30 MHz and above, said power amplifier circuit using parallel power MOSFETs with active drivers without sacrificing frequency response and eliminating frequency limiting components such as resistors, low Q inductors, rf transformers, or any other passive elements increasing the series gate resistances of the power FETs thus limiting the band width, such elements or an active driver are required to prevent spontaneous oscillations in parallel power FETs, comprising:
   a plurality of N-channel power field effect transistors, each of said power field effect transistors having a source terminal coupled to a common potential and having a drain terminal coupled to a common load impedance;

a plurality of active driver circuits, each of said active driver circuits coupled to a common input terminal, each of said active driver circuits coupled to a gate of an associated power field effect transistor, each active driver circuit charging and discharging a gate terminal of said associated power field effect transistor thereby decoupling said associated gate terminal from gate terminals of other of said plurality of field effect transistors;

signal means for providing a first rectangular wave signal activating said plurality of active driver circuits, said circuit means providing a second rectangular wave signal 180° out of phase with said first rectangular wave signal; and a second plurality of power field effect transistors and a second plurality of associated driver circuits, said second driver circuits responsive to said second rectangular wave signals, said power amplifier circuit operating in a push-pull mode of operation.

4. The power amplifier circuit of claim 3 wherein said signal means includes control means for controlling a duty cycle of said first and second rectangular wave in order to provide a one of Class D and Class E operation of said power amplifier circuit.

5. A method of amplifying a r(adio) f(requency) signal in the standard communication frequency range of 1.6 MHz to 30 MHz and above, comprising the steps of:

applying a rectangular wave signal to a plurality of driver circuits, said driver circuits having a generally rectangular wave output signal in response to said rectangular wave input signals, and;

alternately charging and discharging each gate of a plurality of N-channel power FET devices by an associated one of said driver circuits, said power FET devices having output terminals coupled in parallel, wherein said charging step includes the step of coupling an NPN transistor emitter directly to said power FET gate, and wherein said discharging step is performed by coupling a PNP transistor emitter directly to said field effect transistor gate.

6. A power amplifier circuit for coupling a plurality of N-channel power FET devices in parallel, said FET devices operating in the standard R(adio) F(requency) communication range of 1.6 MHz to 30 MHz and above, comprising:

a first N-channel power FET device;

first active driver means coupled to a gate terminal of said first N-channel power FET for driving said first N-channel power FET device from a common input signal terminal and for preventing interaction with other N-channel FET devices resulting in self-induced oscillations;

a second N-channel power FET device; and second active driver means coupled to a gate terminal of said second N-channel power FET device for driving said power FET device from said common input signal terminal and for preventing interaction with other N-channel power FET devices resulting in self-induced oscillation.

7. The power FET amplifier circuit of claim 6 wherein said first active driver means comprises:

a first NPN transistor having an emitter coupled to said gate of said first power FET device; and a first PNP transistor having an emitter coupled to said gate of said first FET device; a base of said first NPN transistor and a base of said first PNP transistor coupled to said common input terminal; and wherein said second transistor means comprises:

a second NPN transistor having an emitter coupled to a gate of said second power FET device; and a second PNP transistor having an emitter coupled to said gate of said power FET device, a base of said second NPN transistor and a base of said second PNP transistor coupled to said common input terminal.

8. The power FET amplifier circuit of claim 6 wherein further comprising a transformer, an output signal from drain terminals of said power FET devices being coupled to a first transformer terminal.

9. A power FET amplifier circuit for coupling a plurality of N-channel power FET devices in parallel, said FET devices operating in the standard R(adio) F(requency) communication range of 1.6 MHz to 30 MHz and above, comprising:

a first N-channel power FET device;

first active driver means coupled to a gate terminal of said first N-channel power FET for driving said first N-channel power FET device from a common input signal terminal and for preventing interaction with other N-channel FET devices resulting in self-induced oscillations;

a second N-channel power FET device;

second active driver means coupled to a gate terminal of said second N-channel power FET device for driving said power FET device from said common input signal terminal and for preventing interaction with other N-channel power FET devices resulting in self-induced oscillation;

an RF broadband transformer, an output signal from drain terminals of said power FET devices being coupled to a first transformer input terminal;

a second set of first and second N-channel power FET devices;

a second set of first and second active driver circuits coupled thereto, said active driver circuits having a second common input terminal associated therewith, said second set of N-channel power FET devices coupled to a second input terminal of said transformer, wherein an input winding of said transformer includes a center-tap terminal for insertion of DC drain potential for said N-channel power FET devices, wherein an output winding of said transformer provides an output signal of said power FET amplifier circuit; and signal means for providing a first rectangular wave signal and for providing a second rectangular wave signal 180° out of phase with said first rectangular wave, wherein said second common input terminal has said first rectangular wave signal applied thereto and said common input terminal has said second rectangular wave signal applied thereto for providing push-pull operation for said power FET amplifier circuit.

* * * * *